United States Patent
Omori et al.

(10) Patent No.: US 9,383,401 B2
(45) Date of Patent: Jul. 5, 2016

(54) DEVICE AND SYSTEM DETECTING BREAKAGE IN DUMMY BUMPS AND METHOD THEREOF

(75) Inventors: Takahiro Omori, Kanagawa-ken (JP); Kenji Hirohata, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 781 days.

(21) Appl. No.: 13/586,163

(22) Filed: Aug. 15, 2012

(65) Prior Publication Data
US 2012/0306529 A1 Dec. 6, 2012

Related U.S. Application Data

(63) Continuation of application No. PCT/JP2010/055694, filed on Mar. 30, 2010.

(51) Int. Cl.
| | | |
|---|---|---|
| *G01R 31/28* | (2006.01) | |
| *G01R 31/04* | (2006.01) | |
| *H01L 25/065* | (2006.01) | |

(Continued)

(52) U.S. Cl.
CPC ............... *G01R 31/048* (2013.01); *G11C 5/04* (2013.01); *G11C 29/025* (2013.01); *G11C 29/50008* (2013.01); *H01L 25/0652* (2013.01); *H01L 25/0657* (2013.01); *H05K 1/0268* (2013.01); *G11C 16/0483* (2013.01); *H01L 2224/45147* (2013.01); *H01L 2225/06513* (2013.01); *H01L 2225/06517* (2013.01); *H01L 2225/06541* (2013.01); *H01L 2924/00014* (2013.01); *H01L 2924/3011* (2013.01);

(Continued)

(58) Field of Classification Search
None
See application file for complete search history.

(56) References Cited

U.S. PATENT DOCUMENTS

| | | | | |
|---|---|---|---|---|
| 6,187,678 B1 * | 2/2001 | Gaynes | ................. | H01L 23/481 257/E23.011 |
| 6,288,346 B1 * | 9/2001 | Ojiri et al. | ..................... | 174/260 |

(Continued)

FOREIGN PATENT DOCUMENTS

| | | |
|---|---|---|
| JP | 61-190955 | 8/1986 |
| JP | 10-093297 | 4/1998 |

(Continued)

OTHER PUBLICATIONS

International Preliminary Report for International Application No. PCT/JP2010/055694 mailed on Oct. 23, 2012.

(Continued)

*Primary Examiner* — Minh N Tang
(74) *Attorney, Agent, or Firm* — Amin, Turocy & Watson LLP

(57) ABSTRACT

There is provided with an electronic device including: a main board, a plurality of electronic substrates, a first chain, a measuring unit and a controller, in which the plurality of electronic substrates each are mounted on the main board via solder joints, the first chain connects the solder joints in series throughout all of the electronic substrates, comprising a plurality of second chains each being a part of the first chain and connecting the solder joints in each corresponding one of the electronic substrates, the measuring unit measures an electrical resistance of the first chain and electrical resistances of the second chains, and the controller detects, if the electrical resistance of the first chain is equal to or higher than a first threshold value, the second chain having an electrical resistance equal to or higher than a corresponding second threshold value from among the second chains.

7 Claims, 20 Drawing Sheets

(51) Int. Cl.
*G11C 5/04* (2006.01)
*G11C 29/02* (2006.01)
*G11C 29/50* (2006.01)
*H05K 1/02* (2006.01)
*G11C 16/04* (2006.01)

(52) U.S. Cl.
CPC .............. *H05K 2201/09781* (2013.01); *H05K 2201/10159* (2013.01); *H05K 2201/10734* (2013.01)

(56) References Cited

U.S. PATENT DOCUMENTS

| | | | | |
|---|---|---|---|---|
| 6,452,502 | B1 * | 9/2002 | Dishongh et al. | 340/653 |
| 6,564,986 | B1 * | 5/2003 | Hsieh | 228/103 |
| 6,895,353 | B2 * | 5/2005 | Barr et al. | 702/117 |
| 6,940,288 | B2 * | 9/2005 | Barr et al. | 324/525 |
| 2006/0001176 | A1 * | 1/2006 | Fukaishi | G11C 5/02 257/777 |
| 2007/0252612 | A1 * | 11/2007 | Sylvester | 324/765 |
| 2008/0048706 | A1 * | 2/2008 | Shimizume | G01R 31/31855 324/762.01 |
| 2010/0250149 | A1 | 9/2010 | Omori et al. | |
| 2011/0271052 | A1 | 11/2011 | Omori et al. | |

FOREIGN PATENT DOCUMENTS

| | | |
|---|---|---|
| JP | 11-087003 | 3/1999 |
| JP | 2006-165325 | 6/2006 |
| JP | 2007-035889 | 2/2007 |
| JP | 2010-093231 | 4/2010 |

OTHER PUBLICATIONS

International Search Report for International Application No. PCT/JP2010/055694 mailed on Jun. 15, 2010.

* cited by examiner

| CHAIN ID | RESISTANCE | FLAG |
|---|---|---|
| SSD CHAIN 1 | ---- | NG |
| N1-1 CHAIN 1 | ---- | OK |
| N2-1 CHAIN 2 | ---- | NG |
| ... | ... | ... |

FIG. 12

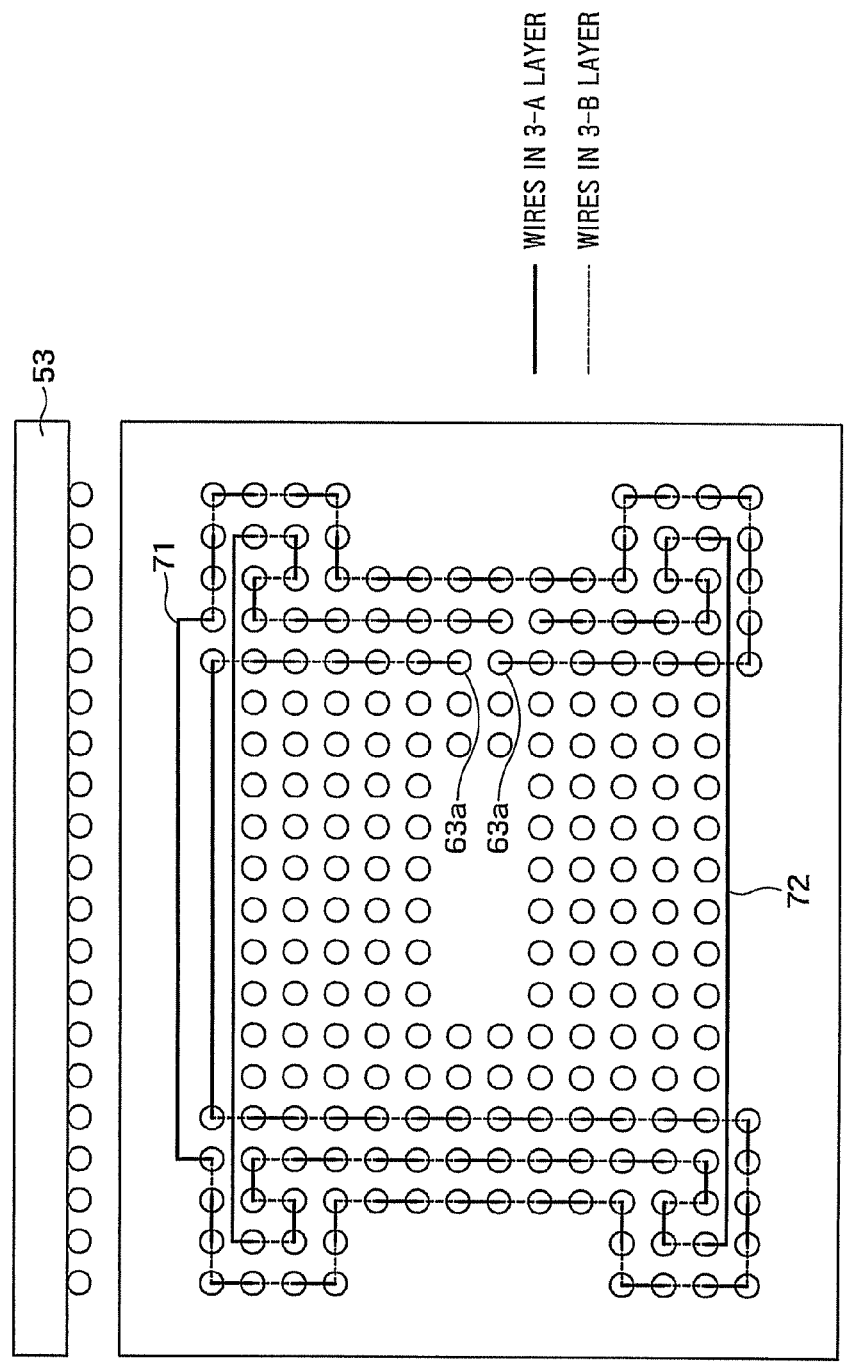

DEVICE AND SYSTEM DETECTING BREAKAGE IN DUMMY BUMPS AND METHOD THEREOF

CROSS REFERENCE TO RELATED APPLICATIONS

This application is a Continuation Application of International Application No. PCT/JP2010/055694, filed on Mar. 30, 2010, the entire contents of which are hereby incorporated by reference.

FIELD

Embodiments described herein relate to an electronic device and an electronic system.

BACKGROUND

In a semiconductor memory device such as an SSD (Solid State Disk), a large number of NAND flash memory packages are electrically connected to a substrate through solder connections. The capacity of each flash memory has increased, and the performance of each flash memory has become more sophisticated in recent years. In this trend, flash memory packages are often in the form of BGAs (Ball Grid Arrays) suitable for high-density packaging. In usage environments, however, many kinds of external forces, such as a thermal load generated by a linear expansion coefficient difference between components, and a load generated by vibration or impact from outside, are applied to the solder joints of BGAs, and there is a constant risk of breakage. Particularly, the solder bumps (hereinafter referred to as bumps) on the outer circumferences of BGAs are most likely to break due to the load generated by heat, vibration, or impact. To prevent easy loss of function of packages due to breakage, those bumps on the outer circumferences are often dummy bumps that are not used for signal lines or power supplies. Such dummy bumps are now expected to be applied to prognostics and health monitoring so that a danger to memory packages can be predicted by detecting breakage in the dummy bumps. JP 10-93297 A discloses a technique for detecting breakage in the dummy bumps at the four corners in a BGA package. Also, JP 2002-76187 A discloses a technique for measuring the resistance of a BGA substrate, and, based on the measurement result, detecting a stressed state among the joints of the BGA substrate.

As described above, a semiconductor memory device such as an SSD includes a large number of semiconductor memory packages. Therefore, the intensity of the mechanical load to be applied varies among the packages, depending on the layout on the substrate. If a certain amount of load is accumulated in a package, functionally-essential solder joints connected to signal lines, power supply lines, and the like are broken, and the information stored in the package is lost. If breakage can be predicted in advance, the information in the package is transferred to another information storage medium when the unsafe level is reached. In this manner, a backup of information can be made before the information is lost.

However, as the number of packages increases, the number of dummy bumps increases. As a result, the time and load required for detection also increase. Also, where RAIDs (Redundant Arrays of Inexpensive Disks) each including SSDs are used, for example, the structure becomes more complicated. As a result, the load applied during the defect detection becomes large, and a long period of time is required.

BRIEF DESCRIPTION OF THE DRAWINGS

FIG. 12 shows an example data structure of the database;

FIG. 20 shows an example chain structure of the upmost substrate in the multilayer NAND flash package of FIG. 17.

DETAILED DESCRIPTION

According to an embodiment, there is provided with an electronic device including: a main board, a plurality of electronic substrates, a first chain, a measuring unit and a controller.

The plurality of electronic substrates each are mounted on the main board via a plurality of solder joints.

The first chain connects the solder joints in series throughout all of the electronic substrates and comprises a plurality of second chains each being a part of the first chain and connecting the solder joints in each corresponding one of the electronic substrates.

The measuring unit measures measure an electrical resistance of the first chain and electrical resistances of the second chains.

The controller detects, if the electrical resistance of the first chain is equal to or higher than a first threshold value, the second chain having an electrical resistance equal to or higher than a corresponding second threshold value from among the second chains.

In this embodiment, an overall circumferential chain that extends through dummy bumps of respective electronic substrates (packages) mounted on a main board is provided. Partial chains of the overall circumferential chain are also provided, and each of the partial chains extends through dummy bumps of each corresponding one of the electronic substrates. Further partial chains of the partial chains are provided so that the partial chains become shorter. In this manner, chains that form a hierarchical structure is provided. When an examination is conducted, the electrical resistance of the overall circumferential chain is measured. If the electrical resistance of the overall circumferential chain is lower than a threshold value, it is determined that there is no problem (breakage) in the joints of all the electronic substrates. If the electrical resistance of the overall circumferential chain is equal to or higher than the threshold value, it is determined that there is a problem in the joint(s) of at least one of the electronic substrates. A chain having an electrical resistance equal to or higher than the threshold value is identified by searching the chains stepwise in the direction toward the lowest hierarchy level. In this manner, the location of a broken bump (a chain on the lowest hierarchy level, for example) can be narrowed down to a small zone in a short time.

The following is a description of this embodiment, with reference to the accompanying drawings.

First Embodiment

Figure 1:
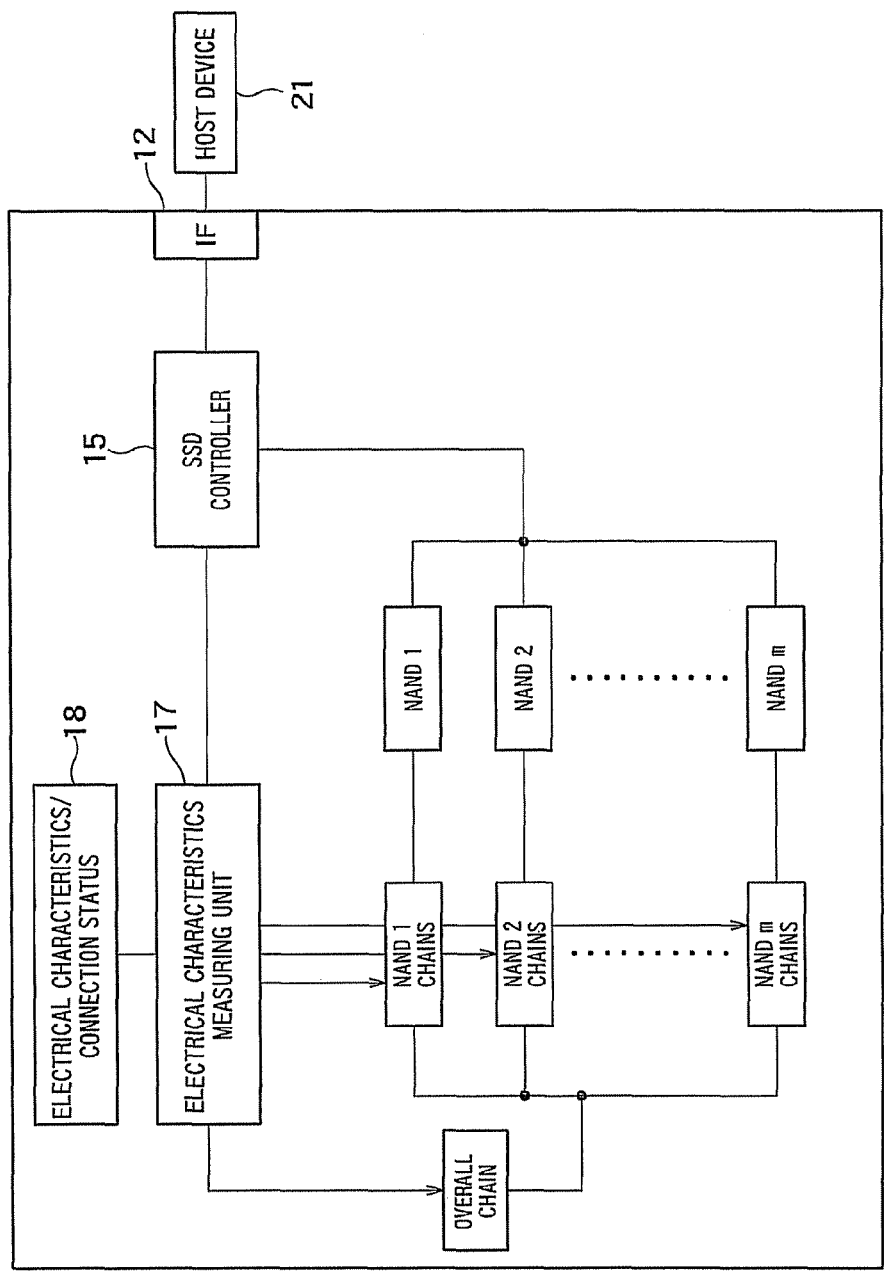
FIG. 1 is a functional block diagram of an SSD (Solid State Disk) as an electronic device according to an embodiment.

FIG. 1 is a functional block diagram of an SSD (Solid State Disk) as an electronic device of this embodiment.

Figure 2:
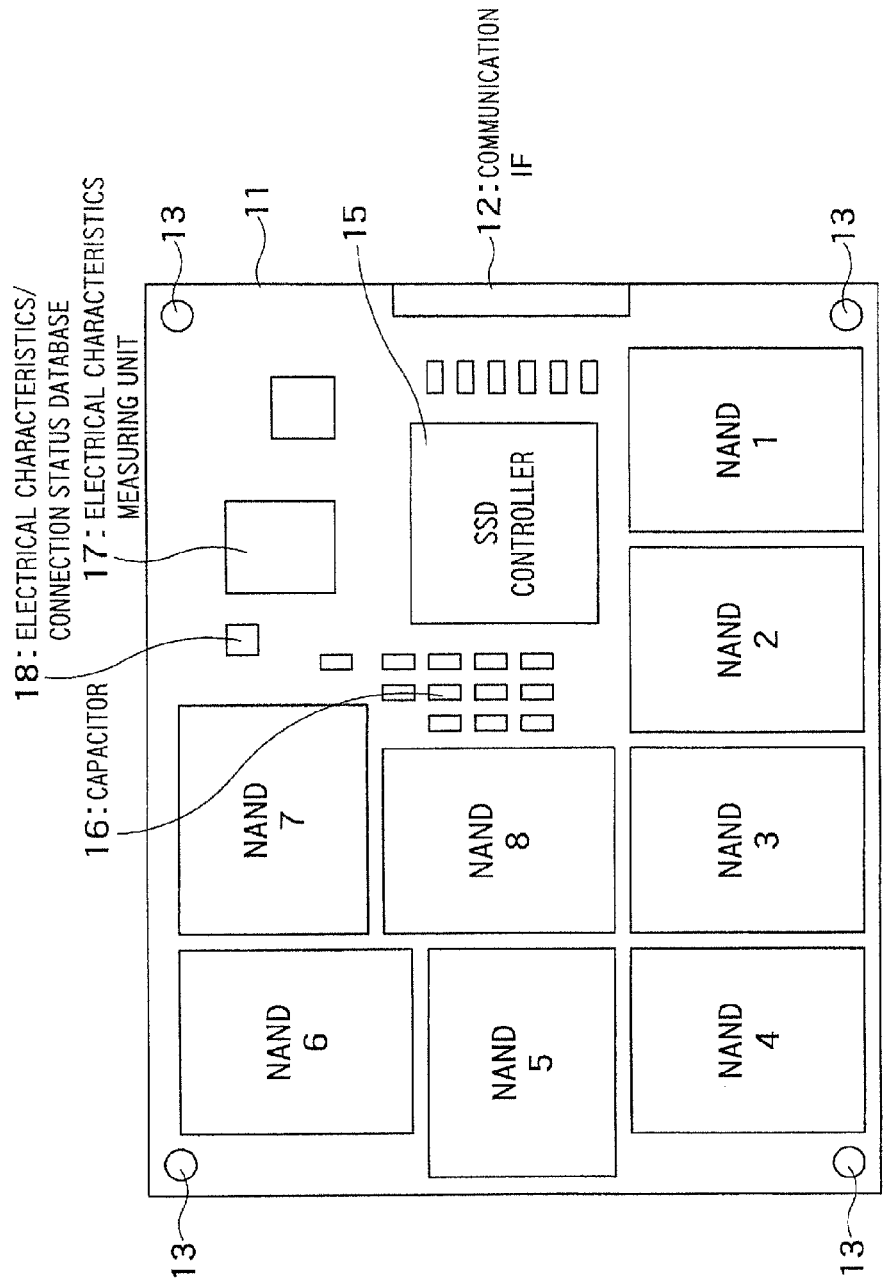
FIG. 2 is a plan view schematically showing the structure of the SSD.

FIG. 2 is a plan view schematically showing the structure of the SSD.

The electronic device of FIG. 1 includes a main board 11 (see FIG. 2), NAND flash memory package devices (hereinafter referred to as NAND flash packages) 1 through m, an SSD controller 15, a communication interface (IF) 12, an electrical characteristics measuring unit 17, an electrical characteristics/connection status database 18, and hierarchical chains that connect dummy bumps of the respective NAND flash packages. In the example shown in FIG. 2, the number of NAND flash packages is 8 (m=8). In FIG. 2, reference numeral 13 denotes boss holes, and reference numeral 16 denotes capacitors.

The NAND flash packages 1 through 8 are equivalent to electronic substrates. The electronic substrates of this embodiment are not limited to the NAND flash memory packages, but may be semiconductor memory packages of some other kind, or may be chips for arithmetic units or the like, instead of memory packages.

The NAND flash packages 1 through 8 each have solder joints (solder bumps) such as a BGA on the back surface thereof. Holding pads (not shown) for holding the solder joints are formed on the main board 11. The solder joints of the NAND flash packages 1 through 8 are positioned and joined to the holding pads on the main board 11, so that the NAND flash packages 1 through 8 are mounted on the main board 11. That is, the NAND flash packages 1 through 8 are physically fixed to the main board 11, and are electrically connected to the main board 11.

The solder bumps of the NAND flash packages 1 through 8 include main bumps to be used as conductive lines such as signal lines or power lines, and dummy bumps not to be used as signal lines or power lines.

Figure 3:
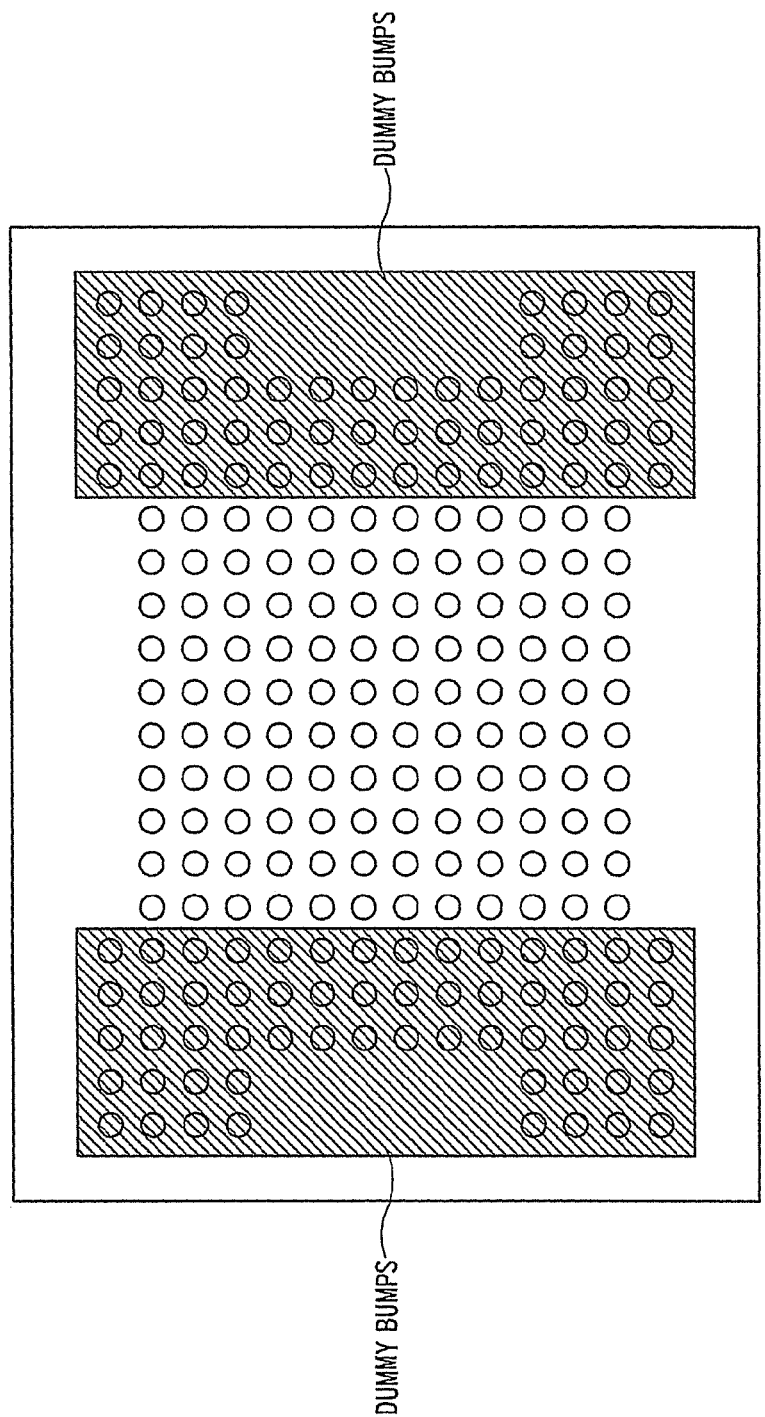
FIG. 3 shows bumps provided on the back surface of a NAND flash package.

FIG. 3 shows the bumps formed on the back surface of one NAND flash package. The solder bumps existing in the hatched areas are dummy bumps, and the solder bumps existing in the unhatched area are main bumps.

A chain that connects dummy bumps in series (or in a continuous manner) is formed with the dummy bumps located on the outermost circumference of each of the NAND flash packages 1 through 8. The chain has a hierarchical structure that is divided into partial chains corresponding to the packages, with further partial chains being included in each of the partial chains.

Likewise, a chain that connects dummy bumps in series is formed with the dummy bumps located on the second outermost circumference of each of the NAND flash packages 1 through 8. The chain also has a hierarchical structure that is divided into partial chains corresponding to the packages, with further partial chains being included in each of the partial chains.

Referring now to FIGS. 4 through 10, the structures of the chains and the hierarchical structure are described. The chains at each of the hierarchy levels are connected to the electrical characteristics measuring unit 17, so that the impedances (in this example, the electrical resistances) thereof can be measured.

Figure 4:
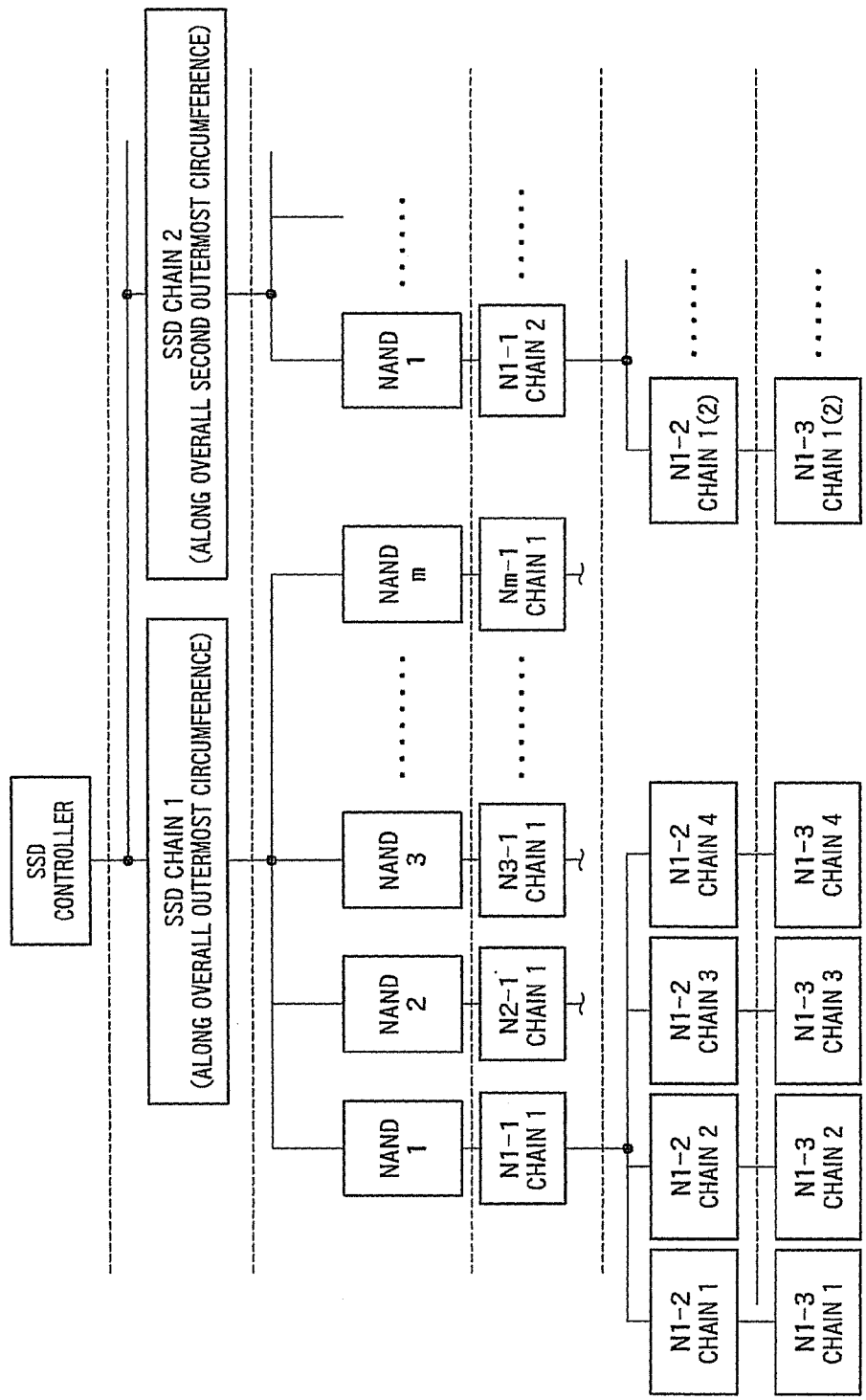
FIG. 4 is a diagram for explaining the hierarchical structure of chains.
Figure 5:
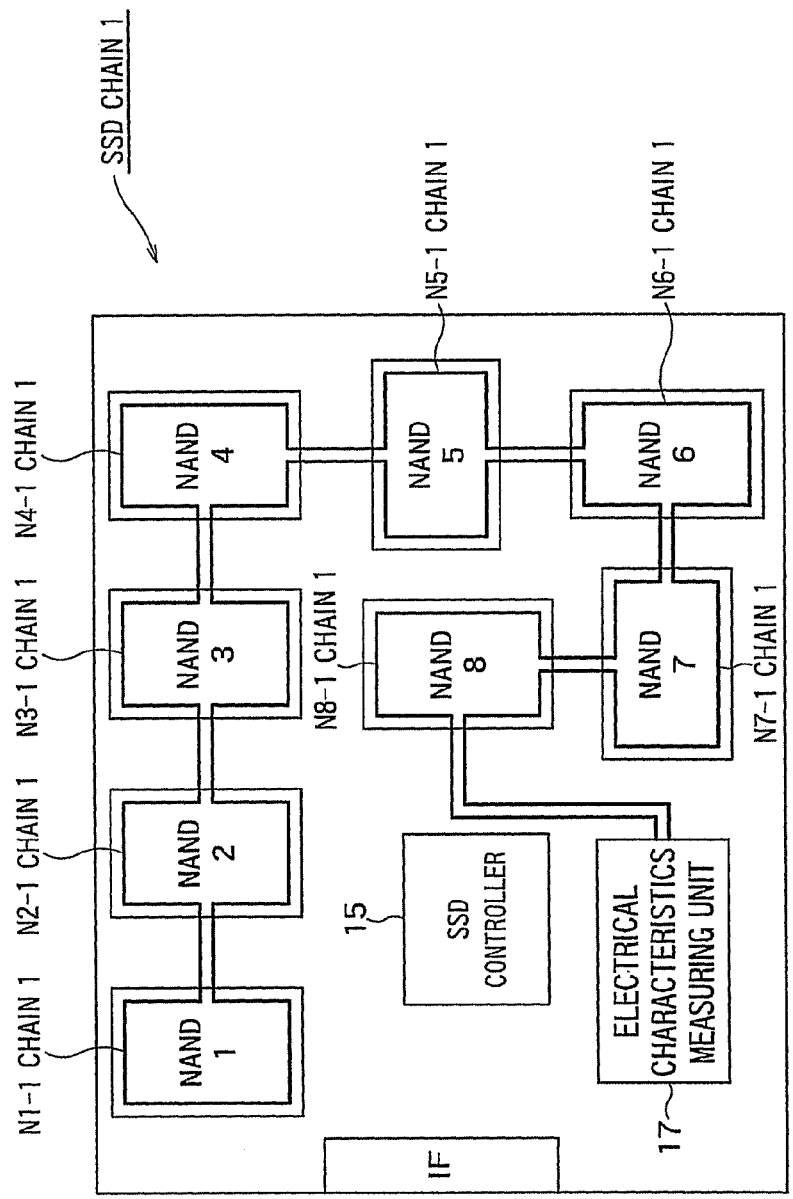
FIG. 5 schematically shows the overall circumferential chain that extends along the outermost circumferences of all the NAND flash packages.

As shown in FIG. 4, an SSD chain 1 (a first chain) is provided to connect the bumps located on the outermost circumference among the dummy bumps of all the packages 1 through m (in this example, m=8) in series with a conductive wire such as a copper wire. FIG. 5 is a schematic view of the SSD chain 1 (though the layout on the main board 11 differs from that shown in FIG. 2). The bumps on the outermost circumference are often the first to break, and such outermost circumferential bumps are included in the SSD chain 1.

Also, an SSD chain 2 (a first chain) may be provided to connect the dummy bumps located on the second outermost circumference among the dummy bumps of all the packages in series with a conductive wire. The bumps located on the second outermost circumference are normally the second to break after the break on the outermost circumference. Likewise, an SSD chain 3 can be provided to connect the dummy bumps located on the Jth outermost circumference in series with a conductive wire throughout all of the packages.

An N1-1 chain 1 of the NAND flash package 1 shown in FIG. 5 is the partial chain (a second chain) corresponding to the NAND flash package 1 in the SSD chain 1. More specifically, the N1-1 chain 1 is the chain that connects (or extends through) the dummy bumps located on the outermost circumference of the NAND flash package 1 in series.

Likewise, there exist N2-1 through N8-1 chains 1 (second chains) corresponding to the NAND flash packages 2 through 8, respectively, in the SSD chain 1 (see FIG. 5). The N2-1 through N8-1 chains 1 are the chains that connect the dummy bumps on the outermost circumferences of the NAND flash packages 2 through 8 in series.

The N1-1 through N8-1 chains 1 are part of the SSD chain 1, and are at a hierarchy level lower than the SSD chain 1 (see FIG. 4).

In FIG. 4, an N1-1 chain 2 of the NAND flash package 1 is the chain (a second chain) corresponding to the NAND flash package 1 in the SSD chain 2. Specifically, the N1-1 chain 2 is the chain that connects the dummy bumps located on the second outermost circumference of the NAND flash package 1.

Likewise, there exist N2-1 through N8-1 chains 2 (second chains) (not shown) corresponding to the NAND flash packages 2 through 8, respectively, in the SSD chain 2. The N1-1 through N8-1 chains 2 are the chains that connect the dummy bumps located on the second outermost circumferences of the NAND flash packages 2 through 8, respectively.

The N1-1 through N8-1 chains 2 are part of the SSD chain 2, and are at a hierarchy level lower than the SSD chain 2.

N1-2 chains 1 through 4 in FIG. 4 are chains (third chains) corresponding to different zones in the N1-1 chain 1, and each includes a corner bump (see FIG. 8, which will be described later). In the N1-1 chain 1, there is a high possibility that the corner bumps will break sooner than any other bumps. The N1-2 chains 1 through 4 are at a hierarchy level lower than the N1-1 chain 1. Likewise, there exist chains below the chains (the N2-1 through Nm-1 chains 1) at the same hierarchy level as the N1-1 chain 1 in the other packages 2 through 8 and also below the N1-1 chain 2 and others (not shown).

An N1-3 chain 1 is a short chain (a third chain) corresponding to a partial zone in the N1-2 chain 1. The N1-3 chain 1 is at a hierarchy level lower than the N1-2 chain 1. The N1-3 chain 1 includes the corner bump in the N1-2 chain 1 (see FIG. 9, which will be described later).

N1-3 chains 2 through 4 are also short chains (third chains) corresponding to partial zones in the N1-2 chains 2 through 4, respectively, and include the corner bumps in the N1-2 chains 2 through 4. The N1-3 chains 2 through 4 are at a hierarchy level lower than the N1-2 chains 2 through 4. Likewise, there exist short chains including the corner bumps in the chains at the same hierarchy level as the N1-2 chains 1 through 4 in the other packages 2 through 8.

With the chains being arranged in the above hierarchical structure, specific locations of breakage can be detected by examining the chains at lower hierarchy levels. This aspect is utilized in this embodiment to conduct an examination in a short time.

For example, the electrical resistance of the SSD chain 1 at the highest level is first measured. If the measured electrical resistance is lower than a threshold value, the junctions between the main board 11 and the NAND flash packages 1 through 8 are determined to be normal. More specifically, the dummy bumps in the SSD chain 1 are determined not to have broken (no breakage has occurred in the SSD chain).

If the electrical resistance of the SSD chain 1 is equal to or higher than the threshold value, on the other hand, it is determined that there exists a broken dummy bump in the SSD chain 1, and the location of the broken dummy bump is identified. Specifically, a chain having an electrical resistance equal to or higher than the threshold value is detected among the chains (the N1-1 through N8-1 chains 1) at a hierarchy level lower than the SSD chain 1. Thereafter, a chain having an electrical resistance equal to or higher than the threshold value is repeatedly detected among the chains at a hierarchy level lower than the previously detected chain. By doing so, the location is narrowed down to a chain at the lowest hierarchy level (in the example shown in FIG. 4, a chain on the same hierarchy level as the N1-3 chain 1). In this manner, the location where a broken dummy bump exists is narrowed down to a limited zone.

At this point, each chain preferably includes dummy bumps near a corner at which breakage easily occurs. At last, a lowest-level chain including only bumps very close to a corner is identified, so that the location of the broken bump can be narrowed down to a limited zone.

Figure 6:
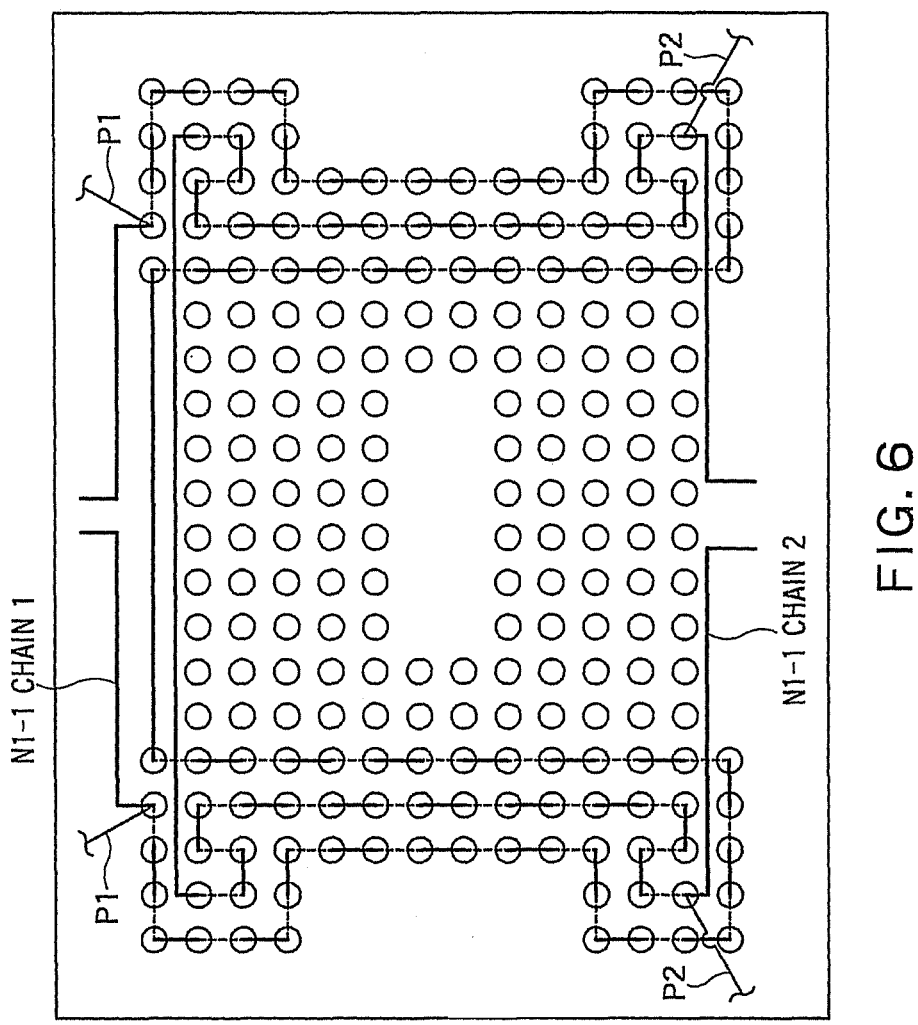
FIG. 6 shows example structures of the chain located on the outermost circumference and the chain located on the second outermost circumference in a NAND flash package.

FIG. 6 shows example structures of the N1-1 chain 1 (the chain located on the outermost circumference) and the N1-1 chain 2 (the chain located on the second outermost circumference) in the NAND flash package 1.

Both ends of the N1-1 chain 1 lead to the chain located on the outermost circumference in the NAND flash package 2 (see FIG. 5), and both ends of the N1-1 chain 2 lead to the chain located on the second outermost circumference in the NAND flash package 2.

Figure 10:
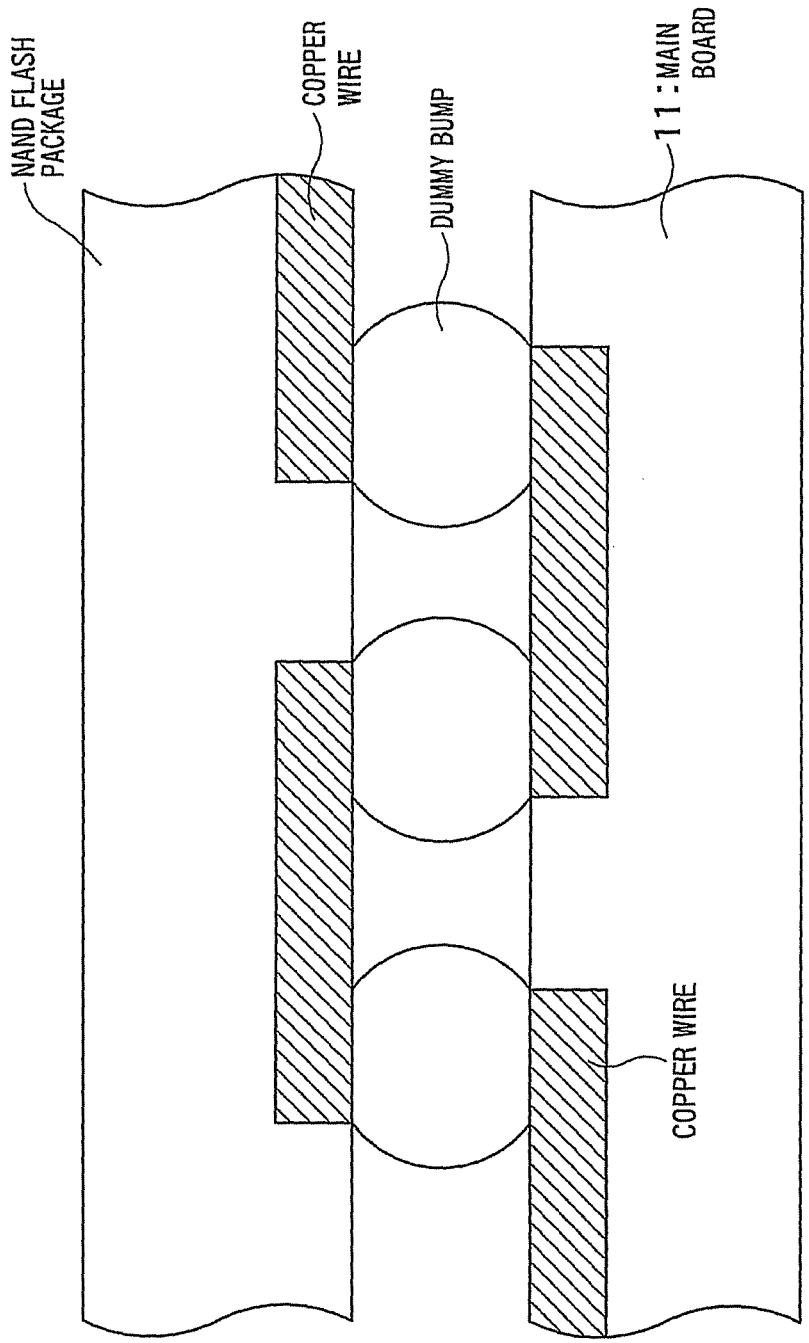
FIG. 10 shows an example structure of a chain.

FIG. 10 specifically shows a chain structure. Each chain connects dummy bumps in series by alternately using copper wires provided in the package and copper wires provided in the main board 11.

Figure 11:
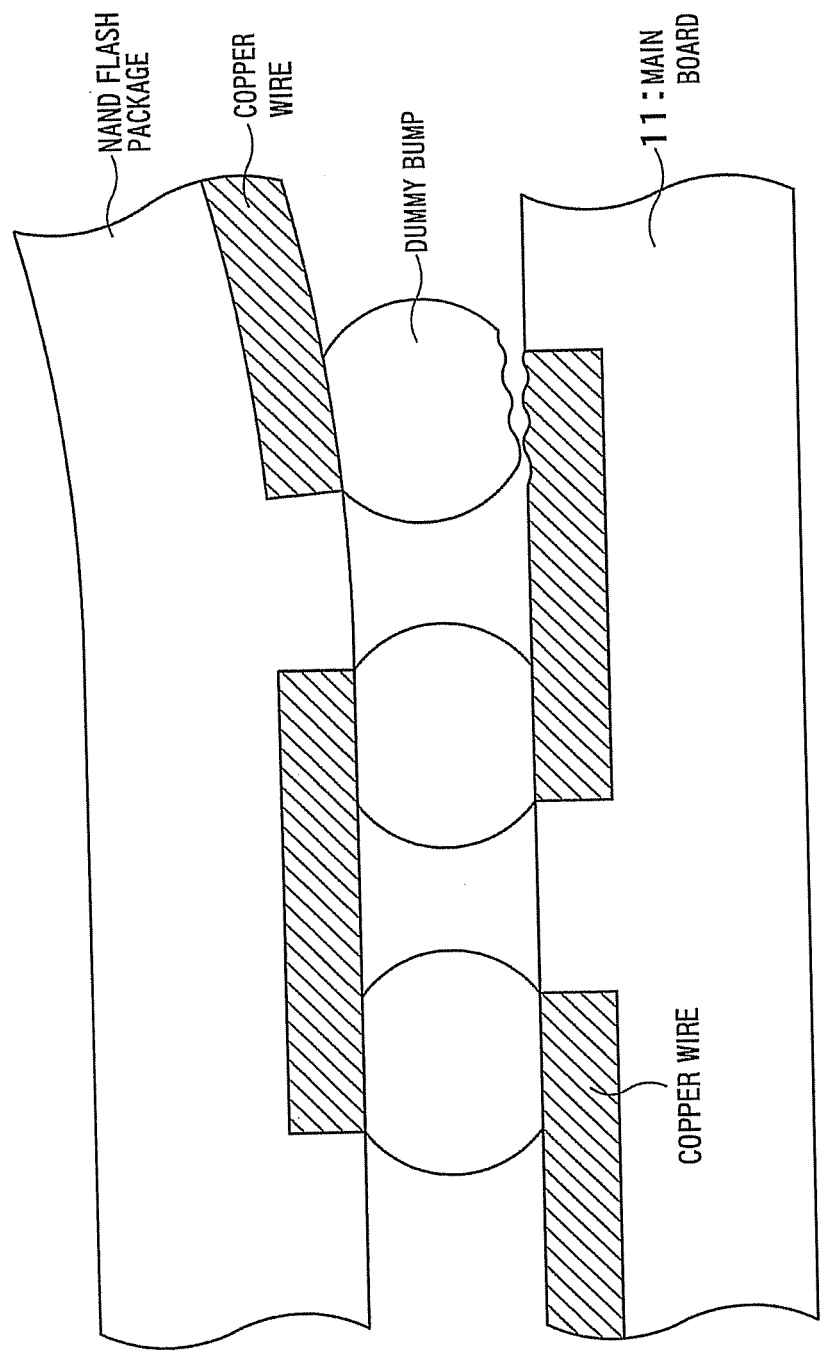
FIG. 11 illustrates a situation where breakage has occurred at a dummy bump (chain breakage)

In FIG. 6, the solid lines represent the copper wires provided in the package, and the dashed lines represent the copper wires provided in the main board 11. In this manner, dummy bumps are connected with the copper wires arranged alternately in the package and the main board 11. Accordingly, when breakage occurs at a dummy bump as shown in FIG. 11, the electrical resistance of the chain dramatically increases so that the breakage can be detected.

When the electrical resistance of the N1-1 chain 1 in FIG. 6 is measured, for example, the dummy bumps serving as measurement points at both ends of the chain are used in the measurement performed by the electrical characteristics measuring unit 17. Wires P1 are connected to the dummy bumps serving as the measurement points, and the wires P1 are also connected to the electrical characteristics measuring unit 17. The electrical characteristics measuring unit 17 turns on and off an inside switch to select a chain to be measured, and measures the electrical resistance or impedance of the selected chain. The electrical resistance of the N1-1 chain 2 is also measured by using the dummy bumps serving as measurement points at both ends of the chain. Wires P2 are connected to the dummy bumps at both ends of the N1-1 chain 2. The layout of the wires P1 and P2 are designed so as not to connect to any chain.

Figure 7:
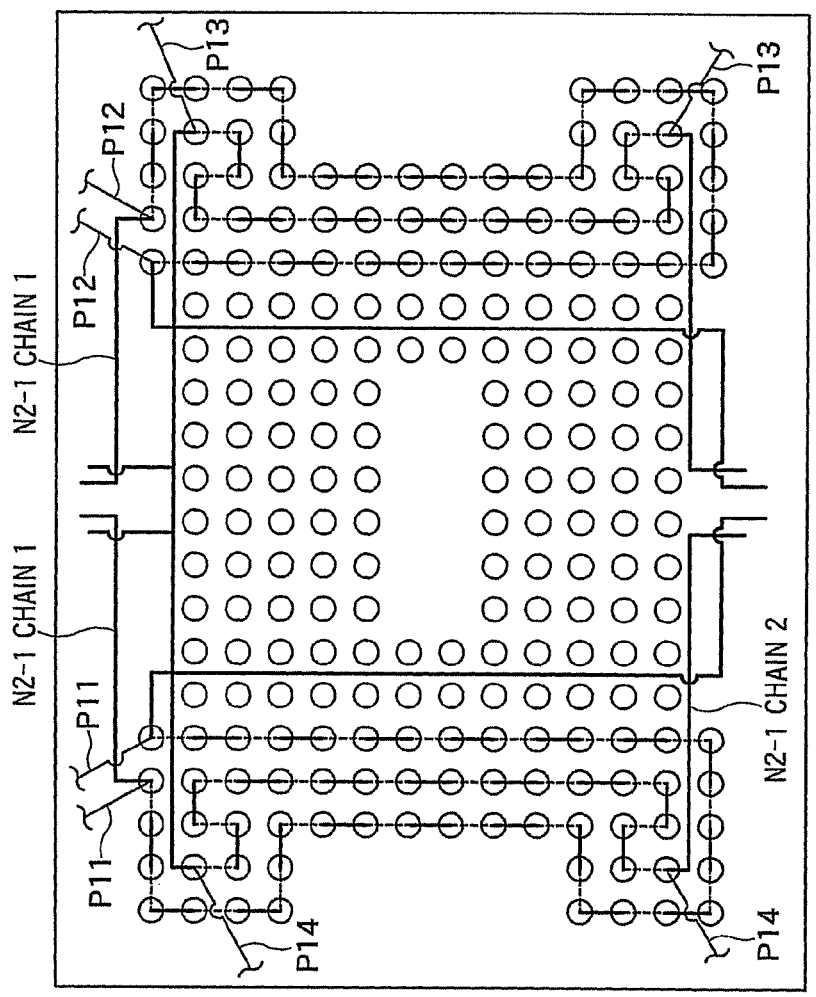
FIG. 7 shows example structures of the chain located on the outermost circumference and the chain located on the second outermost circumference in a different NAND flash package from that of FIG. 6.

FIG. 7 shows example structures of the N2-1 chain 1 (the chain located on the outermost circumference) and the N2-1 chain 2 (the chain located on the second outermost circumference) in the NAND flash package 2. The chains located on the outermost circumferences and the chains located on the second outermost circumferences of the NAND flash packages 3 through 8 have the same structures as those shown in FIG. 7.

The N2-1 chain 1 is divided into two halves (see FIG. 5). When the electrical resistance of the N2-1 chain 1 is measured, the electrical resistances of the two halves of the N2-1 chain 1 are measured separately from each other. That is, in each half chain, the measurement is carried out between the dummy bumps serving as measurement points. In this example, wires P11 are connected to the dummy bumps at both ends of one of the half chains, and wires P12 are connected to the dummy bumps at both ends of the other one of the half chains.

Also, a circuit for temporarily connecting a measurement point (a dummy bump) of one of the two half chains to a measurement point (a dummy bump) of the other one may be provided in the electrical characteristics measuring unit 17, and the electrical resistance of the chain formed by connecting the two half chains may be measured.

The N2-1 chain 2 located on the second outermost circumference is also divided into two halves, and an electrical resistance is measured between the dummy bumps at both ends of each of the half chains. Wires P13 are connected to the dummy bumps at both ends of one of the half chains, and wires P14 are connected to the dummy bumps at both ends of the other one of the half chains.

Figure 8:
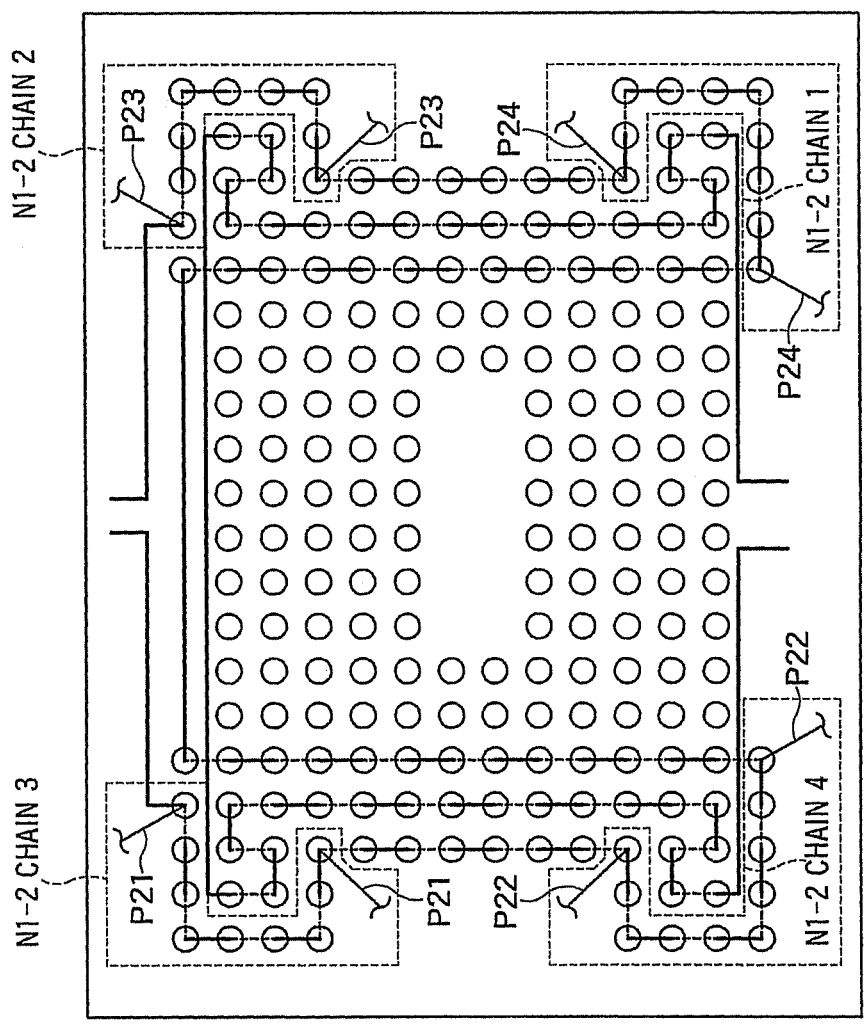
FIG. 8 shows example structures of the chains at a hierarchy level lower than the chain located on an outermost circumference.

FIG. 8 shows example structures of the N1-2 chains 1 through 4. The other chains at the same hierarchy level as the N1-2 chains 1 through 4 (the chains at the same hierarchy level in the other NAND flash packages, and the chains at a hierarchy level lower than the N1-1 chain 2, and the like) have the same structures as those shown in FIG. 8.

In each of the N1-2 chains 1 through 4, the electrical resistance is measured at the dummy bumps serving as measurement points at both ends. The dummy bumps serving as the measurement points are connected to the electrical characteristics measuring unit 17 via wires P21, P22, P23, and P24.

Figure 9:
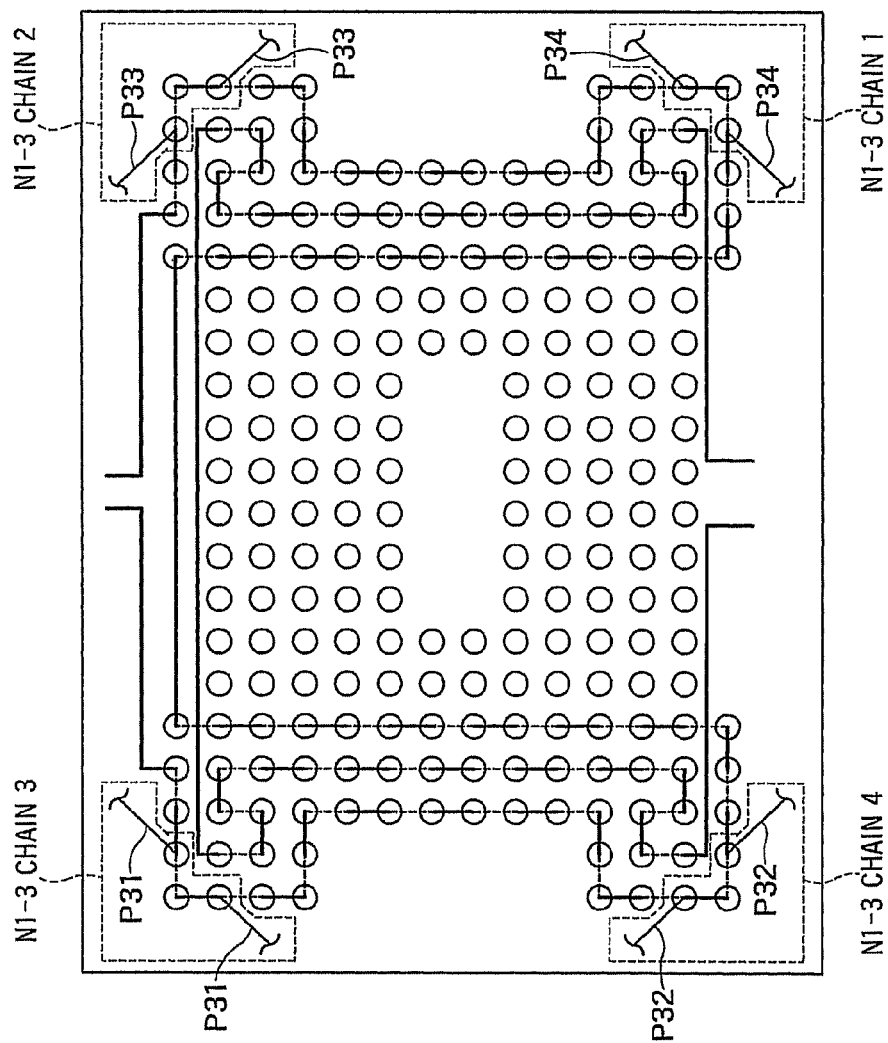
FIG. 9 shows example structures of the chains at two hierarchy levels lower than the chain located on the outermost circumference.

FIG. 9 shows example structures of the N1-3 chains 1 through 4. Each of the chains is short, and includes only a corner bump with a high possibility of breakage and bumps near the corner bump. The other chains at the same hierarchy level as the N1-3 chains 1 through 4 have the same structures as those shown in FIG. 9. In each of the N1-3 chains 1 through 4, the electrical resistance is measured at the dummy bumps serving as measurement points at both ends. The dummy bumps serving as the measurement points are connected to the electrical characteristics measuring unit 17 via wires P31, P32, P33, and P34.

In accordance with an instruction from the SSD controller 15, the electrical characteristics measuring unit 17 of FIG. 1 measures the electrical resistance of a designated chain, and stores the measured electrical resistance and the identifier (ID) of the designated chain into the electrical characteristics/connection status database 18. At this point, a flag indicating whether the electrical resistance is lower than the threshold value may be set, and the flag may also be stored into the database 18. The flag is set to "NG" when the electrical resistance is equal to or higher than the threshold value, and is set to "OK" when the electrical resistance is lower than the threshold value. FIG. 12 shows an example data structure of the database 18.

The electrical characteristics measuring unit 17 returns the measured electrical resistance and the set flag, together with the number (the identifier) of the measured chain, to the SSD controller 15.

When receiving an instruction to read data in the database 18 from the SSD controller 15, the electrical characteristics measuring unit 17 may read designated data (such as the electrical resistance and flag of a designated chain) in the database 18, and return the designated data to the SSD controller 15.

The SSD controller 15 controls the electrical characteristics measuring unit 17, and controls access (data writing, erasing, or updating, for example) to each NAND flash package.

The SSD controller 15 communicates with an external host device 21 via the communication interface (IF) 12. The host device 21 may be a host CPU or a personal computer, for example.

The SSD controller 15 receives an instruction signal for performing health monitoring from the external host device 21. Receiving the instruction signal or detecting an examination event of health monitoring, the SSD controller 15 determines whether breakage has occurred in a dummy bump in a chain at the highest hierarchy level (the SSD chain 1 or the SSD chain 2), using the electrical characteristics measuring unit 17. Where breakage has not occurred, the SSD controller 15 returns a signal as health monitoring examination result information indicating that breakage has not occurred in any dummy bumps, to the external host device 21. Where breakage has occurred, the SSD controller 15 narrows down the location of the broken dummy bump to one zone, and returns a signal as the examination result information identifying the zone (or an identified package or an identified chain), to the external host device 21.

The SSD controller 15 returns the health monitoring examination result information in SMART (Self-Monitoring Analysis and Reporting Technology) format to the external host device 21, for example. The host device 21 may output the received examination result information to an output device such as a display device or a printer, and have an operator check the examination result. Alternatively, the host device 21 may predict or modify the life of the product, based on the examination result information. For example, the main bumps connected to signal lines or power supply lines are located inside the dummy bumps. Therefore, by monitoring the bumps for breakage in the direction from the outermost circumference to the inside, the life of the product before breakage of a main bump can be predicted and modified.

Figure 13:
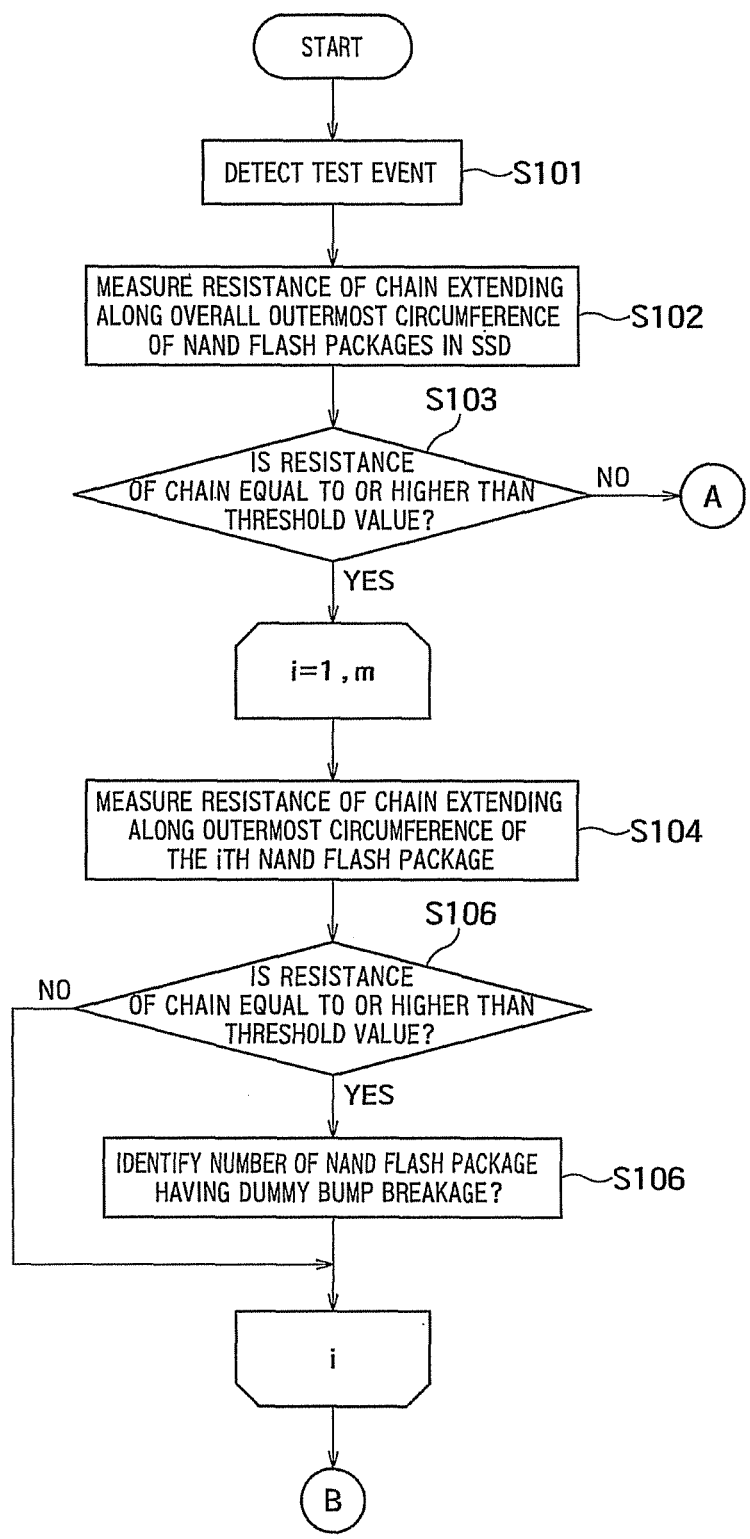
FIG. 13 is a flowchart showing the flow of health monitoring to be performed in the electronic device of FIG. 1.
Figure 14:
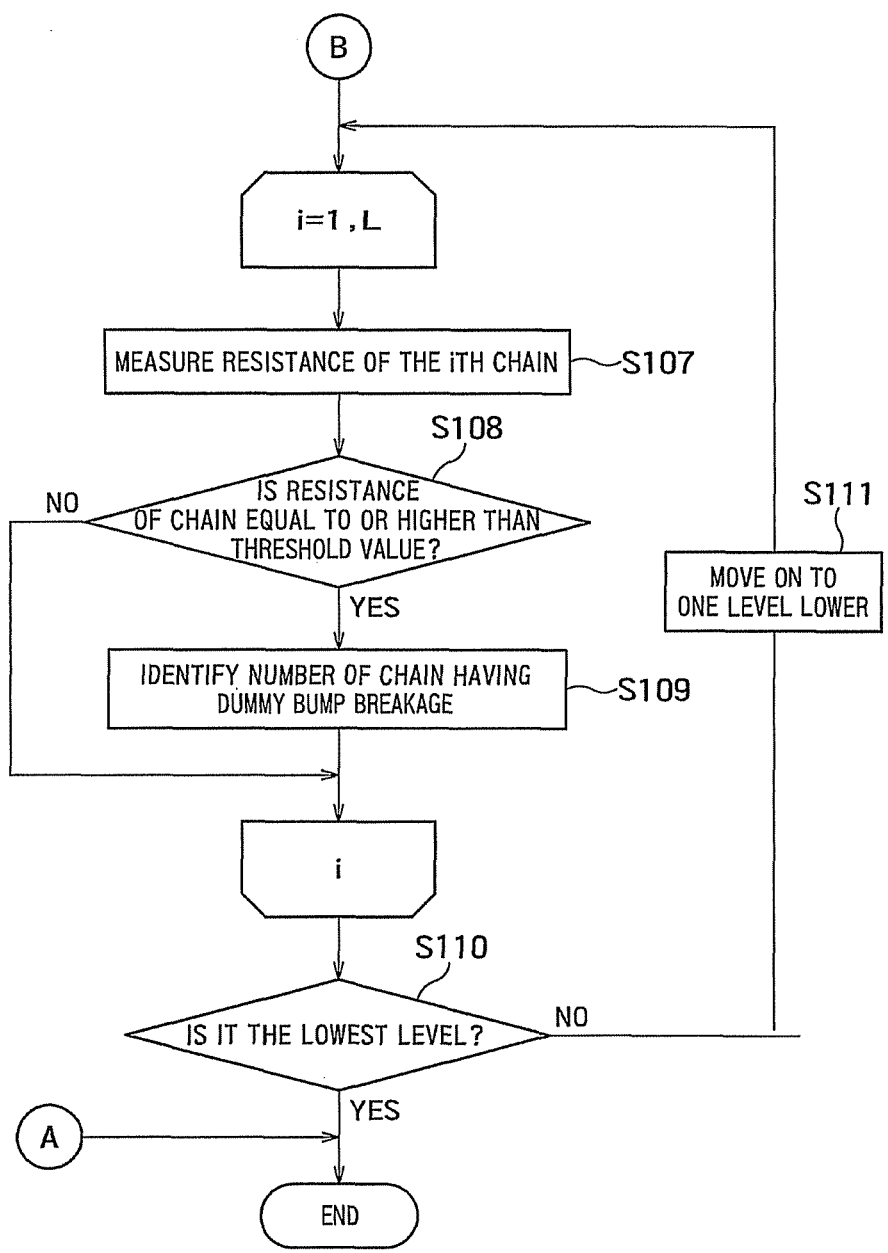
FIG. 14 is a flowchart continuing from FIG. 13.

FIGS. 13 and 14 are a flowchart showing the flow of health monitoring to be performed in the electronic device of FIG. 1.

Detecting a health monitoring examination event (S101), the SSD controller 15 measures the electrical resistance of the SSD chain 1 (a first chain) extending through all the dummy bumps located on the outermost circumferences of all the NAND flash packages, using the electrical characteristics measuring unit 17 (S102).

The SSD controller 15 determines whether the electrical resistance of the SSD chain 1 is equal to or higher than the threshold value (S103). If the electrical resistance value is lower than the threshold value (NO), the SSD controller 15 determines that there is no problem, and ends the health monitoring.

If the electrical resistance of the SSD chain 1 is equal to or higher than the threshold value (YES), the chains at the lower hierarchy levels in the SSD chain 1 are checked, and the locations of breakage are identified. First, the outermost chains (second chains) in the respective NAND flash packages are checked for breakage, and the locations of the bump breakages are narrowed down to NAND flash packages. Specifically, the SSD controller 15 first measures the electrical resistance of the chain (the N1-1 chain 1) extending along the outermost circumference of the first NAND flash package (S104).

If the electrical resistance is lower than the threshold value (NO in S105), the SSD controller 15 determines that there is no problem in the joints of the NAND flash package 1. If the electrical resistance is equal to or higher than the threshold value (YES in S105), the SSD controller 15 identifies the number of the corresponding NAND flash package (or the chain located on the corresponding outermost circumference) (S106). Likewise, the SSD controller 15 measures the electrical resistances of the chains located on the outermost circumferences of the 2nd through mth NAND flash packages. When an electrical resistance is equal to or higher than the threshold value (YES in S105), the SSD controller 15 identifies the number of the corresponding NAND flash package (or the chain located on the corresponding outermost circumference) (S106).

After identifying all the NAND flash packages having breakage, the SSD controller 15 checks the chains (such as the N1-2 chain 1) at lower hierarchy levels than the outermost chains in the respective packages, to further narrow down the locations of breakage.

Specifically, the electrical resistances of the L (L being an integer of 1 or greater) chains (third chains) at a hierarchy level lower than the outermost chain in the identified NAND flash packages are first sequentially measured by the electrical characteristics measuring unit 17, and chains having electrical resistances equal to or higher than the threshold value are identified (YES in S108, and S109). The same measurement and identification are repeated on the chains (third chains) below the identified chains (that is, the flow shown in FIG. 14 is repeated every time a new chain is identified) (NO in S110, and S111). Measurement is not carried out on the chains below the chains with lower electrical resistance than the threshold value.

After the measurement and identification are completed in the lowest-level chains (YES in S110), the health monitoring examination result information including the numbers of the lowest-level chains identified at last is output, and this health monitoring is ended. The examination result information indicates that breakage has occurred in at least one of the solder bumps included in each of the chains identified at last. The examination result information may include the NAND flash package numbers identified in S106.

A lowest-level chain normally includes a corner bump, and breakage normally starts from a corner bump. Therefore, it is considered that at least one lowest-level chain should be identified. However, there is a possibility that a chain having an electrical resistance equal to or higher than the threshold value is not detected through the measurement at a higher level than the lowest level. In that case, the measuring operation is ended at that stage, and the chain at the higher level is set as the chain identified at last. Therefore, health monitoring examination result information that includes the number of that chain is output. The examination result information may also include the NAND flash package numbers identified in S106.

In the above described flow, the SSD chain 1 is examined. However, the inner SSD chains 2, 3, ... may be sequentially examined. Particularly, if a broken bump exists in the SSD chain 1, it is preferable to examine the second outermost SSD chain 2 too. Bump breakage normally starts on the outermost circumference. Therefore, where bump breakage has occurred on the outermost circumference, there is a possibility that bump breakage has also occurred in the SSD chain 2. Accordingly, where breakage has occurred in an SSD chain 3, it is preferable to examine the SSD chain J+1 located on one circumference inside the SSD chain J.

In the above described flow, when breakage in an SSD chain is detected, broken packages are identified. However, to simply determine whether dummy bump breakage has occurred, only the SSD chain may be examined. Further, in the above described flow, when a broken NAND flash package is detected, more specific breakage locations are identified in the detected package. However, in a case where identification of a broken NAND flash package suffices, the operation may be ended at that stage.

As described above, according to the first embodiment, the overall circumferential chain that extends through the outermost bumps of all packages is provided, and the overall circumferential chain is divided into lower-level chains in a hierarchical manner. When an examination is conducted, the examination starts from the overall circumferential chain and moves down to lower hierarchy levels. In this manner, a location of breakage can be detected in a short time. That is, only the overall circumferential chain is first checked at the time of an examination. Only when breakage is occurred, the hierarchical structure is sequentially examined to identify the location of the breakage. In this manner, the examination load can be reduced. Accordingly, the operation to detect breakage can be completed in a reasonable time, and the examination load can be reduced. Thus, maintenance and management can be facilitated, and the risk of data loss due to breakage in solder joints can be lowered.

Second Embodiment

Figure 15:
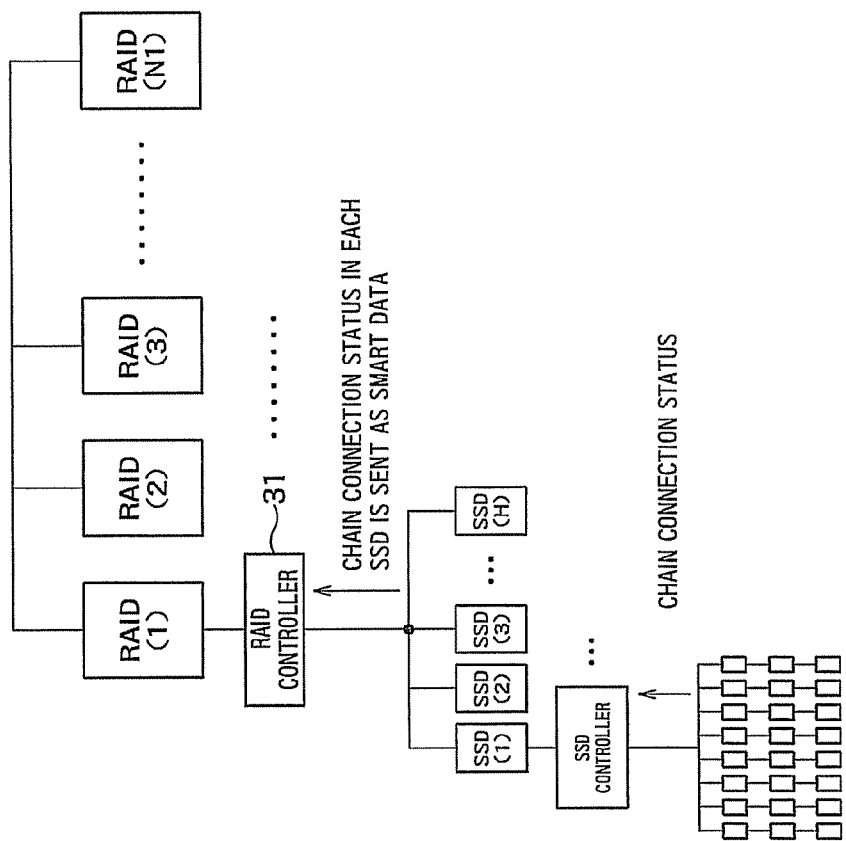
FIG. 15 shows an electronic system with RAID structures each including SSDs.

FIG. 15 shows an electronic system having RAID structures each including SSDs. RAIDs (1) through (N1) are labels representing the RAID structures. In this drawing, only the structure of the RAID (1) is specifically shown, but the structures of the other RAIDs (2) through (N1) may also be connected to a RAID controller 31.

Although the structure and operations of the RAID (1) will be described below, operations of the other RAIDs (2) through (N1) are the same as those of the RAID (1).

The RAID (1) structure includes SSDs (1) through (H), and is connected to the RAID controller 31.

Each of the SSDs has the same structure as that shown in FIGS. 1 and 2. Each of the SSDs is connected to the RAID controller 31. The RAID controller 31 controls the respective SSDs, in accordance with a predetermined RAID method.

The RAID controller 31 sends an examination instruction signal to each of the SSDs of the RAID (1). Each of the SSDs conducts health monitoring, and outputs health monitoring examination result information (or SMART information) to the RAID controller 31.

Each SSD that has no breakage detected through the health monitoring outputs first examination result information indicating that no breakage has occurred in the solder bumps. Each SSD having breakage detected outputs second examination result information identifying the SSD with the detected breakage and the location of the breakage in the SSD (or the identifier of the corresponding package or the identifier of the corresponding chain).

The SMART information about the respective SSDs is collectively managed by the RAID controller 31, and the RAID controller 31 performs appropriate processing on the information.

As described above, according to this embodiment, even in a case where RAIDs (Redundant Arrays of Inexpensive Disks) are formed with SSDs, the locations of defects (defective SSDs, and packages and chains with joint breakage in the defective SSDs) can be detected in a short time.

Third Embodiment

Figure 16:
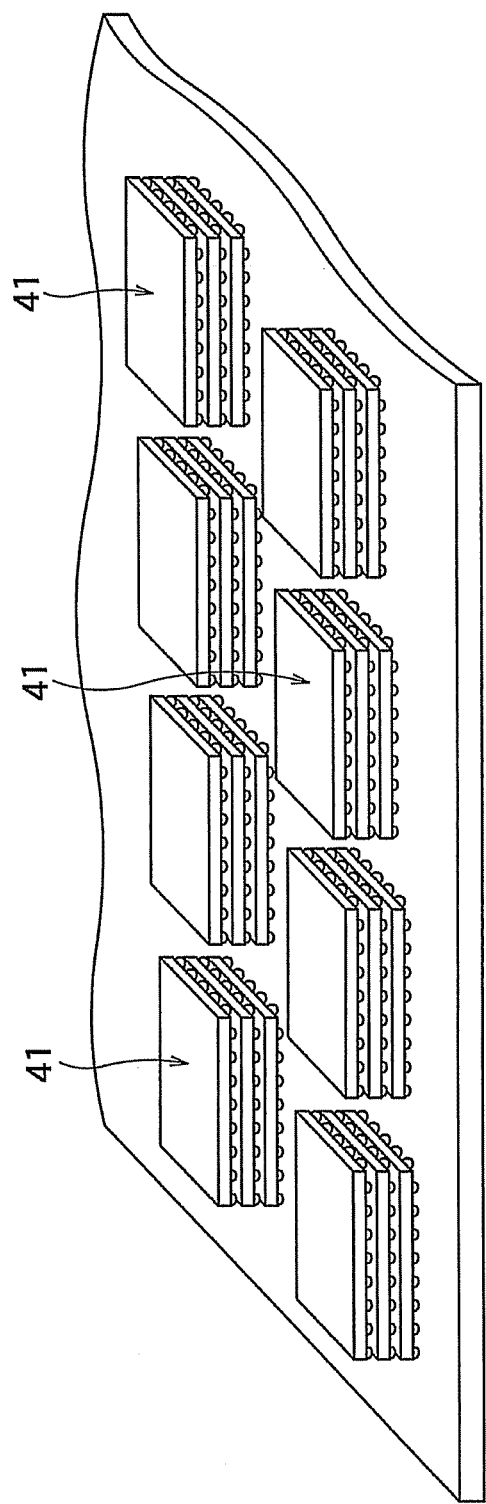
FIG. 16 is a perspective view of an SSD having multilayer NAND flash packages mounted on a main board.

FIG. 16 is a perspective view of an SSD having multilayer NAND flash packages 41 mounted on a main board. This SSD is the same as the SSD of FIG. 1, except that the respective NAND flash packages are replaced with the multilayer NAND flash packages. Other components such as an SSD controller and an electrical characteristics measuring unit and the like are not shown, for simplification.

Each of the multilayer NAND flash packages 41 includes NAND flash substrates that are stacked in the thickness direction (or the direction perpendicular to) the main board 11. The electrical connections among the stacked NAND flash substrates are established by through holes formed in the NAND flash substrates. The through holes are formed by plating holes formed in the NAND flash substrate with a conductive metal such as copper. By another method, interlayer connections may be established by via connections with IVHs (Interstitial Via Holes) and copper wires, if multilayer wiring boards are used in the NAND flash substrates. If the connections penetrate through semiconductors in the NAND flash substrates, silicon penetrating electrodes such as TSVs (Through-Silicon Vias) may be used.

In this embodiment, the through holes and the connection pattern in each of the NAND flash substrates form a chain that connects the dummy bumps of the stacked NAND flash substrates in series. Further, the chains of all the multilayer packages are connected in series, to form an overall circumferential chain that extends through all the multilayer packages. With this arrangement, breakage can be detected by executing substantially the same routine as that of the first embodiment.

Figure 17:
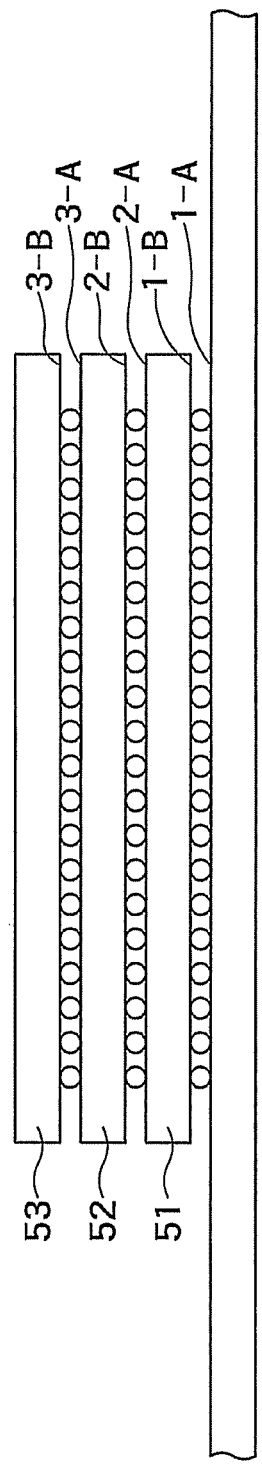
FIG. 17 is a side view of a multilayer NAND flash package in the SSD of FIG. 16.

FIG. 17 is a side view of one of the multilayer NAND flash packages 41 in the SSD of FIG. 16. Three NAND flash substrates (electronic substrates) 51 through 53 are stacked. Reference numeral 1-A denotes the surface layer of a main board 11, 1-B denotes the bottom surface layer of the NAND flash substrate 51, 2-A denotes the top surface layer of the NAND flash substrate 51, 2-B denotes the bottom surface layer of the NAND flash substrate 52, 3-A denotes the top surface layer of the NAND flash substrate 52, and 3-B denotes the bottom surface layer of the NAND flash substrate 53.

Figure 18:
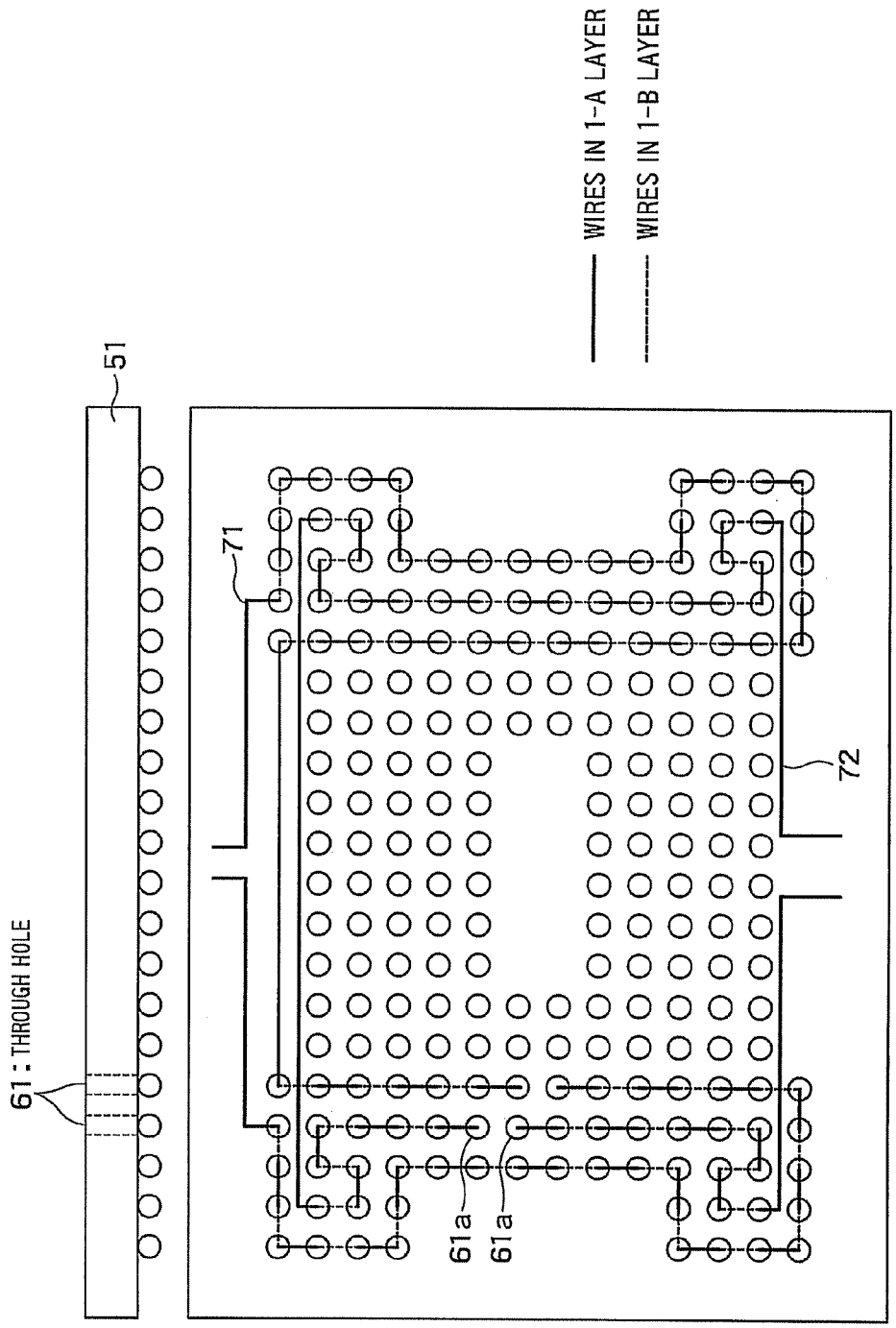
FIG. 18 shows an example chain structure of the lowest substrate in the multilayer NAND flash package of FIG. 17.
Figure 19:
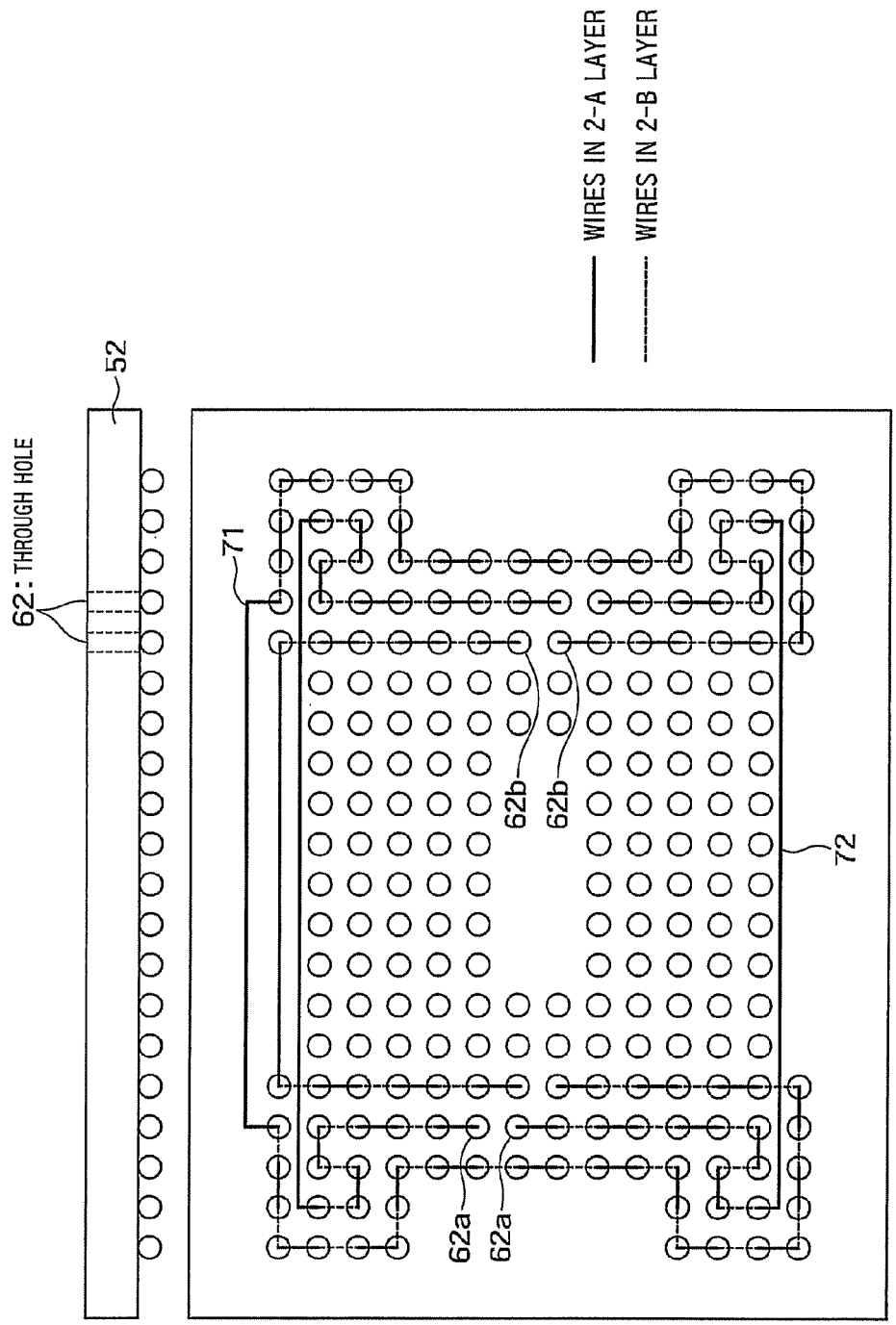
FIG. 19 shows an example chain structure of the intermediate substrate in the multilayer NAND flash package of FIG. 17.

FIGS. 18 through 20 show example chain structures in a specific multilayer NAND flash package in FIG. 17. The specific multilayer NAND flash package is located in the position corresponding to the position of the NAND flash package 1 in the SSD shown in FIG. 3.

As shown in FIG. 18, dummy bumps of the NAND flash substrate 51 are connected by alternately using wires formed in the 1-A layer and wires formed in the 1-B layer, to form chains. Dummy bumps 61a of one of the chains are connected to through holes 61 in the NAND flash substrate 51, and the through holes 61 are connected to dummy bumps of the NAND flash substrate 52 located above the NAND flash substrate 51. Reference numeral 71 denotes the chain located on the outermost circumference, and reference numeral 72 denotes the chain located on the second outermost circumference.

As shown in FIG. 19, dummy bumps of the NAND flash substrate 52 placed above the NAND flash substrate 51 are connected by alternately using wires formed in the 2-A layer and wires formed in the 2-B layer, to form chains. Dummy bumps 62a of one of the chains are connected to the through holes 61 in the NAND flash substrate 51 below the NAND flash substrate 52, and dummy bumps 62b of the other one of the chains are connected to through holes 62 in the NAND flash substrate 53 above the NAND flash substrate 52. The through holes 62 are connected to dummy bumps of the NAND flash substrate 53 above the NAND flash substrate 52.

As shown in FIG. 20, dummy bumps of the NAND flash substrate 53 placed above the NAND flash substrate 52 are connected by alternately using wires formed in the 3-A layer and wires formed in the 3-B layer, to form chains. Dummy bumps 63a of one of the chains are connected to the through holes 62 in the NAND flash substrate 52 below the NAND flash substrate 53.

In FIGS. 18 through 20, the locations of the bumps connected to the through holes are preferably far away from any corner portion. This is because, if bumps near a corner portion are connected to through holes, the bumps might collide with a chain for detecting locations of breakage in the lower layers, and the chains might not be appropriately laid out.

As described above, a chain that connects the stacked NAND flash substrates 51 through 53 is provided as the chain that extends along the circumference of the entire package. Such chains of all the packages are connected together, to form a chain that extends along the circumferences of all the packages.

At the time of health monitoring, the resistance of the overall circumferential chain that connects all the packages is measured. If the electrical resistance is equal to or higher than a threshold value, a package including a chain with an electrical resistance equal to or higher than the threshold value is identified. If necessary, the NAND flash substrate including the chain with the electrical resistance equal to or higher than the threshold value is identified in the identified package. Thereafter, an examination can be conducted on the identified substrate in the same manner as in the first embodiment.

As described above, according to the third embodiment, in an SSD having multilayer NAND flash packages mounted thereon, examines of an overall circumferential chain and partial chains are also combined. Accordingly, by executing the same routine as that of the first embodiment, breakage can be detected, and the location of the breakage can be identified in a short time.

The invention claimed is:

1. An electronic device comprising:
a main board;
a plurality of electronic substrates each being mounted on the main board via a plurality of solder joints;
a first chain to connect the solder joints in series throughout all of the electronic substrates, the first chain comprising a plurality of second chains each being a part of the first chain and connecting the solder joints in each corresponding one of the electronic substrates;
a measuring unit to measure an electrical resistance of the first chain and electrical resistances of the second chains; and
a controller configured to
control the measuring unit to measure the electrical resistance of the first chain to obtain the electrical resistance of the first chain, when the electrical resistance of the first chain is equal to or higher than a first threshold value, control the measuring unit to measure the electrical resistances of the second chains to obtain the electrical resistances of the second chains, and detect the second chain having the electrical resistance equal to or higher than a corresponding second threshold value from among the second chains, wherein
the electronic substrates are stacked in a thickness direction of the main board, and
the electronic substrates are mutually joined via the solder joints.

2. The electronic device according to claim 1, wherein
the measuring unit measures electrical resistances of a plurality of third chains corresponding to different constituent parts of the second chain detected by the controller, and
the controller detects the third chain having the electrical resistance equal to or higher than a corresponding third threshold value among the third chains.

3. The electronic device according to claim 1, wherein
the first chain includes wires formed in the main board and wires formed in the electronic substrates, the solder joints are connected in series where the wires formed in the main board and the wires formed in the electronic substrates are used alternately.

4. The electronic device according to claim 1, wherein
the solder joints connected by the first chain are solder joints located on outermost circumference of each of the electronic substrates among all of the solder joints of the electronic substrates.

5. The electronic device according to claim 1, wherein
the solder joints connected by the first chain are dummy joints.

6. An electronic system comprising:
a plurality of electronic devices, each of the electronic devices being the electronic device according to claim 1; and
a control device configured to control the electronic devices, wherein
the control device transmits an examination instruction signal to each of the electronic devices, and each of the electronic devices:
  measures the electrical resistance of the first chain, in accordance with the examination instruction signal,
  transmits first examination result information to the control device when the electrical resistance of the first chain is lower than the first threshold value, the first examination result information indicating that there is no breakage in the solder joints of the electronic device, and
  detects the second chain having an electrical resistance equal to or higher than the corresponding second threshold value and transmits second examination result information to the control device when the electrical resistance of the first chain is equal to or higher than the first threshold value, the second examination result information indicating that breakage has occurred in at least one of the solder joints of the electronic substrate corresponding to the second chain having the electrical resistance equal to or higher than the corresponding second threshold value.

7. A method comprising:
  measuring an electrical resistance of a first chain wherein the first chain connects solder joints in series throughout all of a plurality of electronic substrates each being mounted on a main board via the solder joints, the first chain comprising the second chains each being a part of the first chain and connecting the solder joints in each corresponding one of the electronic substrates; and
  measuring electrical resistances of the second chains when the measured electrical resistance of the first chain is equal to or higher than a first threshold value;
  detecting the second chain having the electrical resistance equal to or higher than a corresponding second threshold value from among the second chains, based on the measured electrical resistances of the second chains, wherein
  the electronic substrates are stacked in a thickness direction of the main board, and
  the electronic substrates are mutually joined via the solder joints.

\* \* \* \* \*